US011353485B2

(12) United States Patent
Jefferies et al.

(10) Patent No.: US 11,353,485 B2
(45) Date of Patent: Jun. 7, 2022

(54) EMBEDDED HIGH FREQUENCY GROUND MONITOR

(71) Applicant: Schneider Electric USA, Inc., Andover, MA (US)

(72) Inventors: Kevin M. Jefferies, Raleigh, NC (US); Matthew L. White, Cary, NC (US); Benjamin W. Edwards, Rolesville, NC (US); Richard K. Weiler, Wake Forest, NC (US); Alan E. Freeman, Raleigh, NC (US)

(73) Assignee: Schneider Electric USA, Inc., Boston, MA (US)

( * ) Notice: Subject to any disclaimer, the term of this patent is extended or adjusted under 35 U.S.C. 154(b) by 74 days.

(21) Appl. No.: 16/787,278

(22) Filed: Feb. 11, 2020

(65) Prior Publication Data

US 2021/0247429 A1 Aug. 12, 2021

(51) Int. Cl.
| | |
|---|---|
| *G01R 27/28* | (2006.01) |
| *G01R 27/18* | (2006.01) |
| *G01R 31/00* | (2006.01) |
| *G01R 29/08* | (2006.01) |
| *G01R 31/58* | (2020.01) |
| *G01R 29/10* | (2006.01) |
| *G01R 17/20* | (2006.01) |

(52) U.S. Cl.
CPC ......... *G01R 27/18* (2013.01); *G01R 29/0821* (2013.01); *G01R 29/0835* (2013.01); *G01R 29/105* (2013.01); *G01R 31/001* (2013.01); *G01R 31/002* (2013.01); *G01R 31/58* (2020.01); *G01R 17/20* (2013.01); *G01R 29/0871* (2013.01)

(58) Field of Classification Search
CPC .............. G01R 29/0835; G01R 31/001; G01R 31/002; G01R 29/0821; G01R 29/105; G01R 29/0871; G01R 31/58; G01R 17/20; G01R 27/18
USPC ........... 324/76.11–76.83, 459, 600, 612, 627
See application file for complete search history.

(56) References Cited

U.S. PATENT DOCUMENTS

| | | | | |
|---|---|---|---|---|
| 2002/0107647 | A1* | 8/2002 | Anderson | G06F 30/367 |
| | | | | 702/65 |
| 2013/0169269 | A1* | 7/2013 | Bickel | H02J 13/00034 |
| | | | | 324/126 |
| 2014/0371929 | A1* | 12/2014 | Allen | H02J 13/00004 |
| | | | | 700/286 |
| 2019/0302168 | A1* | 10/2019 | Gaouda | G01R 31/086 |
| 2020/0341035 | A1* | 10/2020 | Mallett | G01R 15/16 |
| 2021/0350237 | A1* | 11/2021 | Litichever | H04L 63/1416 |

\* cited by examiner

*Primary Examiner* — Raul J Rios Russo
(74) *Attorney, Agent, or Firm* — Locke Lord LLP (57) ABSTRACT

A measurement module receives a defined system topology and system component characteristics information for a system. The measurement module calculates an expected system impedance for the defined system topology. The measurement module collects one or more impedance measurements using a high frequency voltage stimulus. Finally, the measurement module compares the one or more impedance measurements with the expected system impedance to determine adequacy of protective grounding of the system.

20 Claims, 5 Drawing Sheets

EMBEDDED HIGH FREQUENCY GROUND MONITOR

TECHNICAL FIELD

The present disclosure relates to electrical ground monitoring systems, and more particularly, to creating a high frequency ground monitor for a system with capacitive grounding by applying high frequency voltage and measuring return current.

BACKGROUND

Good design practice for electronic devices that are planned to operate in electrically noisy environments is to provide a suitable capacitive grounding connection for the device. Electrical noise is typically random, high frequency voltage oscillations conducted from the device's power source or parasitically coupled from nearby electrical components or cables. Noise sources may range from conducted voltage oscillations produced by motor switch-gear in the same power network, to electromagnetic radiation produced by nearby cables or by the operation of a nearby cell phone. Electronic devices with embedded digital processors or digital transmitters, which are subjected to electrical noise, may generate computational or communication errors. To minimize the adverse effects of random, high frequency electrical noise, an electronic device will typically be designed with its chassis ground conductor connected to a grounding capacitor that will be fastened to a system ground bus at the time of installation of the device in the system. The capacitive coupling to ground enhances electromagnetic compatibility (EMC) by minimizing the adverse effects of random, high frequency electrical noise on the operation of embedded digital processors or digital transmitters. The connection to the system ground bus may be by means of a conductive clip, screw or other fastener, or by soldering. However, over time, the effectiveness of the conductive connectors and solder joints may be reduced by mechanical vibration and/or chemical corrosion, reducing the capacitive coupling of the device to the system ground bus. This eventual loss of the capacitive coupling to ground may result in the embedded digital processors or digital transmitters generating computational or communication errors, when exposed to random, high frequency electrical noise.

What is needed is an embedded measurement module that monitors the adequacy of the capacitive grounding of the electronic devices in the system. Monitoring of the capacitive grounding would be provided over the operating life of the system, either on a frequent schedule, on demand by an operator, or in response to detected error conditions in the system. An alert would be provided when reduction or loss of the capacitive coupling to ground is detected. Operators may then adjust, repair or replace conductive connectors and solder joints in the capacitive grounding circuit to prevent the embedded digital processors or digital transmitters from generating computational or communication errors.

SUMMARY

In accordance with one embodiment described herein, a measurement module receives a defined system topology and system component characteristics information for a system. The measurement module calculates an expected system impedance for the defined system topology. The measurement module collects one or more impedance measurements using a high frequency voltage stimulus. Finally, the measurement module compares the one or more impedance measurements with the expected system impedance to determine the adequacy of the capacitive grounding of the system.

In accordance with one embodiment described herein, a high frequency signal generator in the measurement module provides the high frequency voltage stimulus by injecting a high frequency test signal into the components connected through grounding capacitance to a reference ground of the system. A high frequency current measurement circuit in the measurement module measures actual return current collectively from the components through the grounding capacitance, in response to the test signal, to obtain the one or more measurements of the actual system impedance of the system. The measurement module determines whether the actual system impedance substantially equals the expected system impedance. The measurement module characterizes the adequacy of the capacitive grounding of the system based on the determination.

The measurement module monitors the capacitive grounding over the operating life of the system, based at least on a frequent schedule, on demand by an operator, or in response to detected error conditions in the system. The measurement module provides an alert when reduction or loss of the capacitive coupling to ground is detected.

The resulting method, apparatus, system, and computer program product provide a high frequency ground monitor for a system to determine whether the system has adequate protective capacitive grounding, by applying high frequency voltage and measuring return current.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

Figure 1A:
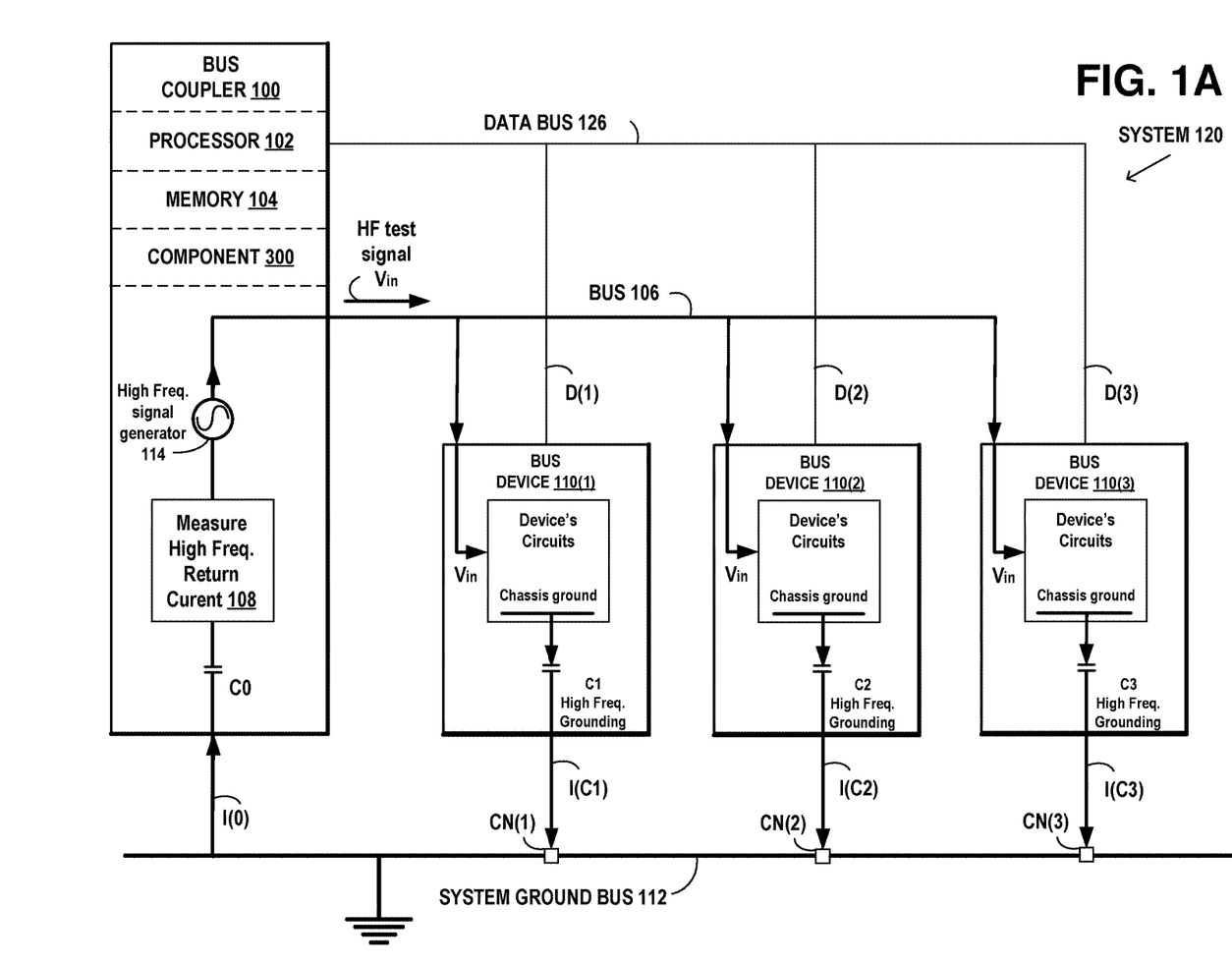
FIG. 1A is an example functional block diagram of a bus coupler injecting a high frequency signal into electronic devices connected to the bus in the system and monitoring the adequacy of capacitive grounding of the electronic devices, according to an embodiment of the disclosure.
Figure 1B:
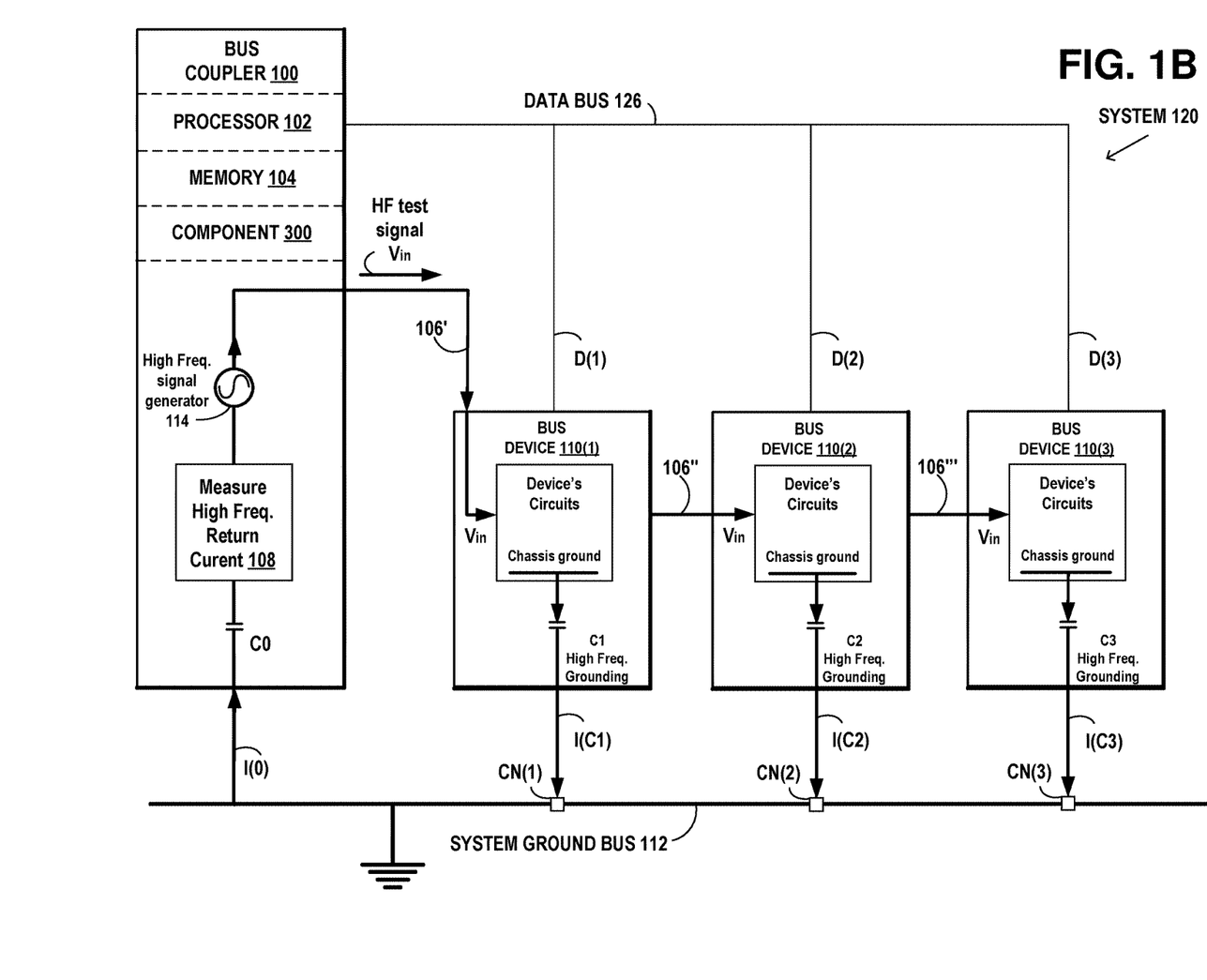
FIG. 1B is another example functional block diagram of a bus coupler injecting a high frequency signal into a series connected arrangement of electronic devices connected to the bus in the system and monitoring the adequacy of capacitive grounding of the electronic devices, according to an embodiment of the disclosure.

FIG. 1A is an example functional block diagram of a system 120 that includes a bus coupler 100 having a high frequency signal generator 114 that provides a high frequency voltage stimulus by injecting a high frequency test signal $V_{in}$ into one or more components or electronic devices 110(1), 110(2), and 110(3), connected to a bus 106 in the system 120. The high frequency test signal yin may be in the range of 5-10 kHz, which may be set by the manufacturer of the electronic devices 110(1), 110(2), and 110(3), depending on a variety of factors specific to the devices. An example of a defined system topology in FIG. 1A may be a parallel arrangement of the electronic devices 110(1), 110(2), and 110(3) between the bus 106 and a system reference ground or ground bus 112. FIG. 1B is another example of a defined system topology of a bus coupler injecting a high frequency signal into a series connected arrangement of electronic devices connected to the bus in the system and monitoring the adequacy of capacitive grounding of the electronic devices. A high frequency current measurement circuit 108 measures the return current I(0)(actual) collectively from all of the electronic devices 110(1), 110(2), and 110(3) in response to the injection of the high frequency test signal Vin on the bus 106, to determine the adequacy of respective capacitive grounding C1, C2, and C3 of the electronic devices 110(1), 110(2), and 110(3), according to an embodiment of the disclosure. The monitoring may be either on a frequent schedule, on demand by an operator, or in response to detected error conditions in the system. The bus coupler 100 includes at least one processor 102 and at least one memory 104 that includes computer program code that, when executed by operation of the processor 102, performs operations of logic blocks in the component 300. The high frequency signal generator 114, the high frequency current measurement circuit 108, the at least one processor 102, the at least one memory 104, and the logic blocks in the component 300 comprise the embedded high frequency ground monitor of the bus coupler 100.

In another embodiment, the high frequency signal generator 114 may inject a high frequency test current into the one or more components or electronic devices 110(1), 110(2), and 110(3) in the system 120 and measure voltage to monitor the adequacy of capacitive grounding of the electronic devices, in a similar manner to the previously discussed technique of injecting a high frequency test voltage and measuring the return current.

A data bus 126 enables the bus coupler 100 to monitor the electronic devices 110(1), 110(2), and 110(3) for error conditions that may be symptomatic of a failure of capacitive grounding of one of the electronic devices that may be generating the error conditions. Data D(1), D(1), and D(1) output by respective electronic devices 110(1), 110(2), and 110(3) on the data bus 126, is monitored by bus coupler 100. The measurements of capacitive grounding may be made in response to the detection of errors in data computation or in signal transmission from any of the bus devices 110(1), 110(2), and 110(3).

The electronic devices 110(1), 110(2), and 110(3) may include embedded digital processors such as programmable logic controllers or digital transmitters such as bus transceivers to perform computational or communication operations. The electronic devices are provided with capacitive coupling to ground to enhance adequacy of protective grounding. Adverse effects of random, high frequency electrical noise are minimized by connecting the chassis ground conductor of each device's circuits to a respective grounding capacitor C1, C2, and C3. At the time of installation of the device in the system, the grounding capacitor is fastened to the system reference ground or ground bus 112 by connectors CN(1), CN(2), and CN(3). The capacitive coupling of the electronic devices 110(1), 110(2), and 110(3) to the ground bus 112 will minimize the adverse effects of random, high frequency electrical noise, on the operation of the embedded digital processors or digital transmitters. The connection to the system ground bus 112 may be by means of a conductive clip, screw or other fastener, or by soldering.

The effectiveness of the connection of conductive connectors and solder joints CN(1), CN(2), and CN(3) to the system ground bus 112 may be reduced over time by mechanical vibration and/or chemical corrosion. To measure the adequacy of the capacitive grounding of the electronic devices 110(1), 110(2), and 110(3) in the system 120, the bus coupler 100 includes a high frequency signal generator 114 that injects a high frequency test signal $V_{in}$ into electronic devices 110(1), 110(2), and 110(3) over the bus 106. The test signal $V_{in}$ may be applied to the power input terminal or other terminal of each of the electronic devices 110(1), 110(2), and 110(3) in the system 120. The measurements may be made either on a frequent schedule, on demand by an operator, or in response to detected error conditions in the system.

When a bus device 110(1), for example, is added by an operator to the bus 106, the chassis ground of the device is connected through the grounding capacitor C1 to the system ground bus 112 by means of a connector CN(1). The value of the grounding capacitance C1 may be stated in the device's specification or it may be measured. The value of each of the grounding capacitances C1, C2, and C3 of the electronic devices 110(1), 110(2), and 110(3) connected to the bus 106, is stored in the memory 104 of the bus coupler 100.

The power input terminal or other terminal of the device 110(1) is connected through the bus 106 to the high frequency signal generator 114 in the bus coupler 100. The frequency of the high frequency test signal yin output by the signal generator may be set by the operator or it may be a predetermined frequency, either of which value is stored in the memory 104 of the bus coupler 100. The value of the frequency of the high frequency test signal yin establishes the value of the derivative dV/dt for the signal. The value of the peak or RMS voltage of the high frequency test signal $V_{in}$ is also stored in the memory 104 of the bus coupler 100.

The processor 102 in the bus coupler 100 may execute program code in the logic blocks in the component 300 to calculate an expected high frequency current I(C1)(expected) that would be conducted from the device 110(1) through the grounding capacitor C1 to the system ground bus 112 in response to receiving the high frequency test signal yin at the device's power input terminal or other terminal. The expected current value would be the current that would be conducted by the grounding capacitor C1 if its connection CN(1) to the system grounding bus 112 had good conductive integrity. The expected high frequency current I(C1)(expected) is calculated as:

$$I(C1)(\text{expected}) = C1 * dV/dt.$$

A similar calculation is performed by the processor 102 for each of the electronic devices 110(1), 110(2), and 110(3) connected to the bus 106. Then the expected high frequency return current I(0)(expected) is calculated as the sum of the expected high frequency currents I(C1)(expected), I(C2)(expected), and I(C3)(expected) from each of the respective electronic devices 110(1), 110(2), and 110(3) in the system 120. The expected high frequency return current I(0)(expected) is for the defined system topology of the system 120 shown in FIG. 1A. The values of C1, C2, and C3 are the system component characteristics information for the system 120. The value of the expected high frequency return current I(0)(expected) is stored in the memory 104 of the bus coupler 100. The expected system impedance Z(0)(expected) corresponding to the expected return current I(0)(expected) is the ratio of the high frequency test signal yin to the expected return current I(0)(expected). The value of the expected system impedance Z(0)(expected) is stored in the memory 104 of the bus coupler 100. In embodiments, the calculation of the expected high frequency return current I(0)(expected) and the expected system impedance Z(0)(expected) may be performed at any time and need not be limited to when the electronic devices are installed in the system.

Throughout the normal operating life of the device, monitoring may be conducted to test whether there is adequate high frequency grounding for each of the bus devices 110(1), 110(2), and 100(3). The bus coupler 100 includes an embedded high frequency current measurement circuit 108 to measure the actual high frequency current I(0)(actual), which is the sum of the actual high frequency currents I(C1)(actual), I(C2)(actual), and I(C3)(actual) from each of the respective electronic devices 110(1), 110(2), and 110(3) in the system 120. The high frequency current measurement circuit 108 measures the actual high frequency current I(0)(actual) passing through the capacitor C0 in the bus coupler 100. The actual system impedance Z(0)(actual) corresponding to the actual return current I(0)(actual) is the ratio of the high frequency test signal Vin to the actual return current I(0)(actual).

The measurements may be made either on a frequent schedule, on demand by an operator, or in response to detected error conditions in the system. The measurements may be coordinated to occur at the same times as the high frequency test signal $V_{in}$ is generated by the high frequency signal generator 114. The measurements may be made at example intervals ranging from less than 1 millisecond to a day or more and may be periodic, aperiodic, or on demand by the operator. The measurements may be made by a power-on self-test algorithm which conducts the measurement when the electronic device is turned on. The measurements may be made in response to the detection of errors in data computation or in signal transmission from any of the bus devices 110(1), 110(2), and 110(3). In some embodiments, the capacitive grounding may be considered adequate for a device when computational or communication errors generated by the capacitive grounding can be tolerated for certain applications of the device or can be corrected by digital error detection and correction techniques.

The processor 102 in the bus coupler 100 may execute program code in the logic blocks in the component 300 to determine if the actual high frequency return current I(0)(actual) equals or approximately equals the expected high frequency return current I(0)(expected). If the actual and expected return currents are equal or approximately equal, then the grounding capacitors C1, C2, and C3 are passing the respective actual high frequency currents I(C1)(actual), I(C2)(actual), and I(C3)(actual) that are equivalent to the respective expected high frequency currents I(C1)(expected), I(C2)(expected), and I(C3)(expected). This indicates that the grounding capacitors C1, C2, and C3 have a good connection to the system grounding bus. The processor 102 in the bus coupler 100 may also execute program code in the logic blocks in the component 300 to determine if the actual system impedance Z(0)(actual) equals or approximately equals the expected system impedance Z(0)(expected). If the actual and expected system impedances are equal or approximately equal, then the grounding capacitors C1, C2, and C3 are passing the respective actual high frequency currents I(C1)(actual), I(C2)(actual), and I(C3)(actual) that are equivalent to the respective expected high frequency currents I(C1)(expected), I(C2)(expected), and I(C3)(expected). This indicates that the grounding capacitors C1, C2, and C3 have a good connection to the system grounding bus 112.

However, if the actual and expected return currents are determined to be not equal or not approximately equal, or if the actual and expected system impedances are determined to be not substantially equal, then the grounding capacitors C1, C2, and C3 are not passing the respective actual high frequency currents I(C1)(actual), I(C2)(actual), and I(C3)(actual) that would be equivalent to the respective expected high frequency currents I(C1)(expected), I(C2)(expected), and I(C3)(expected). This indicates that one or more of the grounding capacitors C1, C2, and C3 does not have a good connection to the system grounding bus. In response, an alert may be generated by the bus coupler 100 when loss of the capacitive coupling to ground is detected, allowing the conductive connectors and solder joints to be adjusted, repaired or replaced by the operator.

FIG. 1B is another example of a defined system topology of bus coupler 100 injecting the high frequency signal yin into a series connected arrangement of the electronic devices 110(1), 110(2), and 110(3) connected to the bus in the system 120 and monitoring the adequacy of capacitive grounding of the electronic devices. The high frequency signal $V_{in}$ is conducted on the conductor 106' to the electronic device 110(1). The high frequency signal yin is then conducted on the conductor 106" to the series connected electronic device 110(2). The high frequency signal yin is then conducted on the conductor 106''' to the series connected electronic device 110(3). The high frequency current measurement circuit 108 measures the return current I(0)(actual) collectively from all of the electronic devices 110(1), 110(2), and 110(3) in response to the injection of the high frequency test signal $V_{in}$ on the conductor 106' to the series connected electronic devices 110(1), 110(2), and 110(3) in FIG. 1B, to determine the adequacy of respective capacitive grounding C1, C2, and C3 of the electronic devices 110(1), 110(2), and 110(3).

Figure 2A:
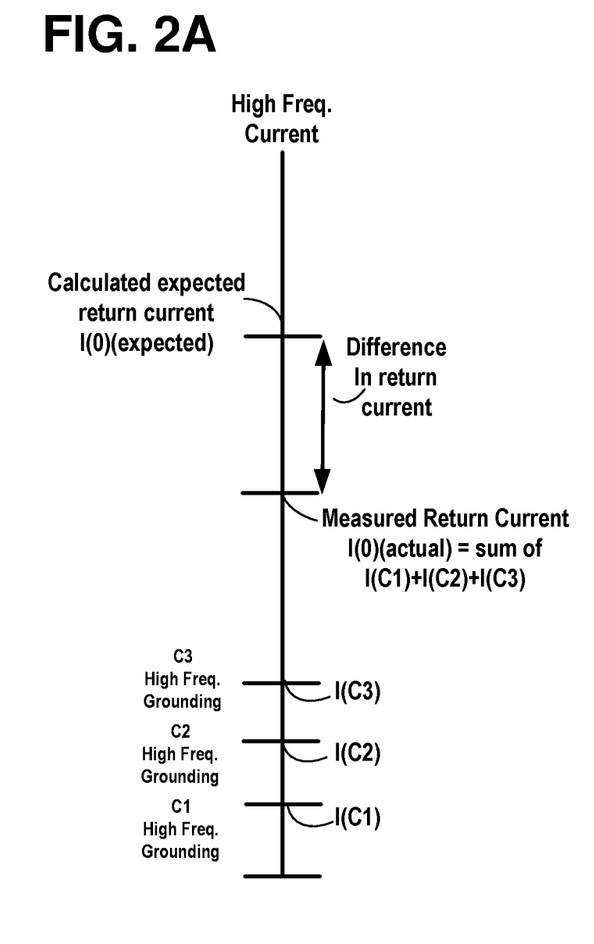
FIG. 2A shows an example graph of the return currents from the electronic devices connected to the bus of FIG. 1A, in response to the high frequency signal, according to an embodiment of the disclosure.

FIG. 2A shows an example graph of the return currents from the electronic bus devices 110(1), 110(2), and 100(3) connected to the bus 106 of FIG. 1A, in response to the high frequency test signal yin generated by the high frequency signal generator 114, according to an embodiment of the disclosure. The measured return current I(0)(actual)=sum of I(C1)+I(C2)+I(C3). The graph shows when the actual high frequency current I(0)(actual) does not equal or does not approximately equal the expected high frequency return current I(0)(expected). This indicates that the grounding capacitors C1, C2, and C3 are not passing the respective actual high frequency currents I(C1)(actual), I(C2)(actual), and I(C3)(actual) that would be equivalent to the respective expected high frequency currents I(C1)(expected), I(C2)(expected), and I(C3)(expected). One or more of the grounding capacitors C1, C2, and C3 does not have a good connection to the system grounding bus.

Figure 2B:
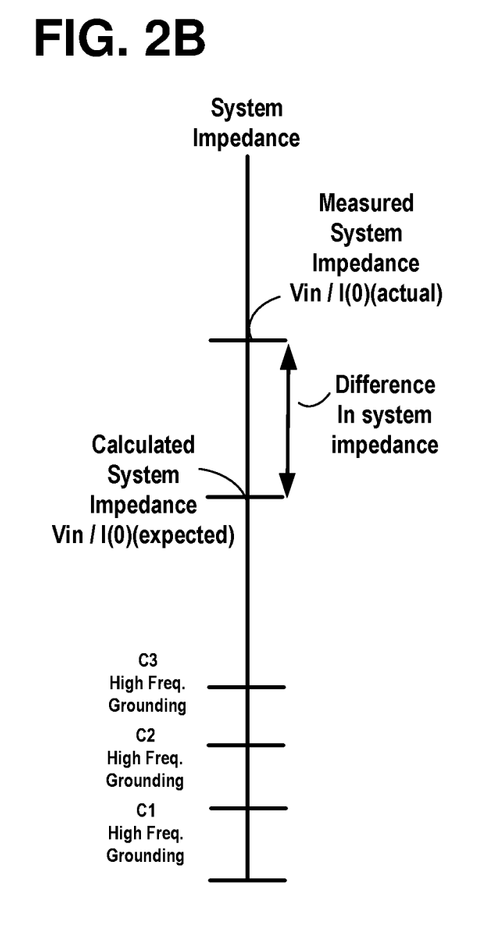
FIG. 2B shows an example graph of the system impedance of the system of electronic devices connected to the bus of FIG. 1A, in response to the high frequency signal, according to an embodiment of the disclosure.

FIG. 2B shows an example graph of the system impedance of the system of electronic devices connected to the bus of FIG. 1A, in response to the high frequency signal $V_{in}$, according to an embodiment of the disclosure. The graph shows that the actual and expected system impedances are determined to be not substantially equal, indicating that the grounding capacitors C1, C2, and C3 are not passing the respective actual high frequency currents I(C1)(actual), I(C2)(actual), and I(C3)(actual) that would be equivalent to the respective expected high frequency currents I(C1)(expected), I(C2)(expected), and I(C3)(expected). This indicates that one or more of the grounding capacitors C1, C2, and C3 does not have a good connection to the system grounding bus. In response, an alert may be generated by the bus coupler 100 when loss of the capacitive coupling to ground is detected, allowing the conductive connectors and solder joints to be adjusted, repaired or replaced by the operator.

Figure 3:
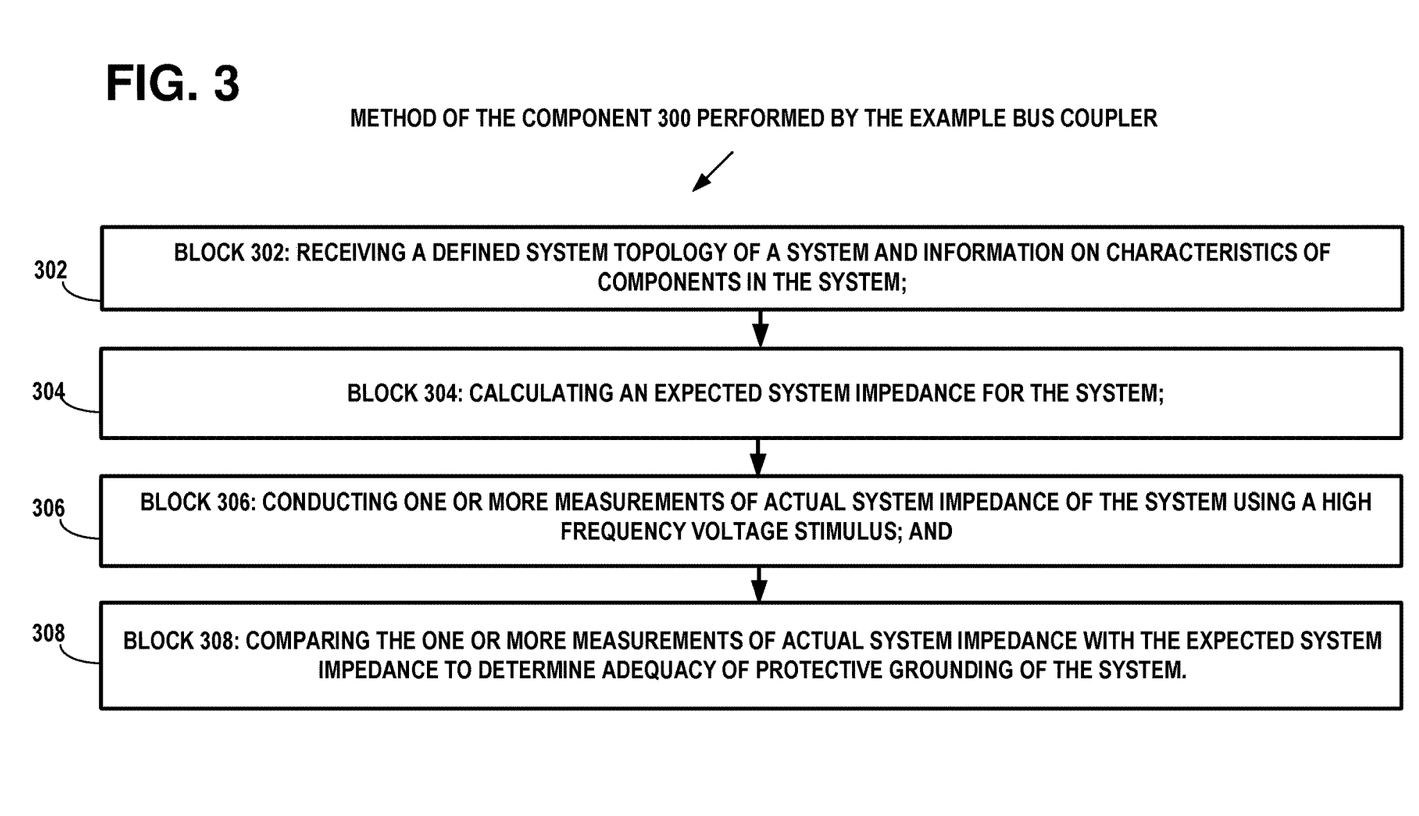
FIG. 3 is an example flow diagram of a method performed by the example bus coupler of FIG. 1A, according to an embodiment of the disclosure.

FIG. 3 is an example flow diagram of a method of the component 300 performed by the example bus coupler of FIG. 1A, according to an embodiment of the disclosure. The logic blocks of the flow diagram may be implemented by computer program instructions stored in the memory 104 and executed by the processor 102 in the bus coupler 100 of FIG. 1A. Alternately, the logic blocks of the flow diagram may also be implemented by computer hardware logic in the bus coupler 100 of FIG. 1A, which can carry out the functions specified by the logic blocks.

The method performed by the example bus coupler 100, comprises the following logic blocks:

Block 302: receiving a defined system topology of a system and information on characteristics of components in the system;

Block 304: calculating an expected system impedance for the system;

Block 306: conducting one or more measurements of actual system impedance of the system using a high frequency voltage stimulus; and Block 308: comparing the one or more measurements of actual system impedance with the expected system impedance to determine adequacy of protective grounding of the system.

Figure 4:
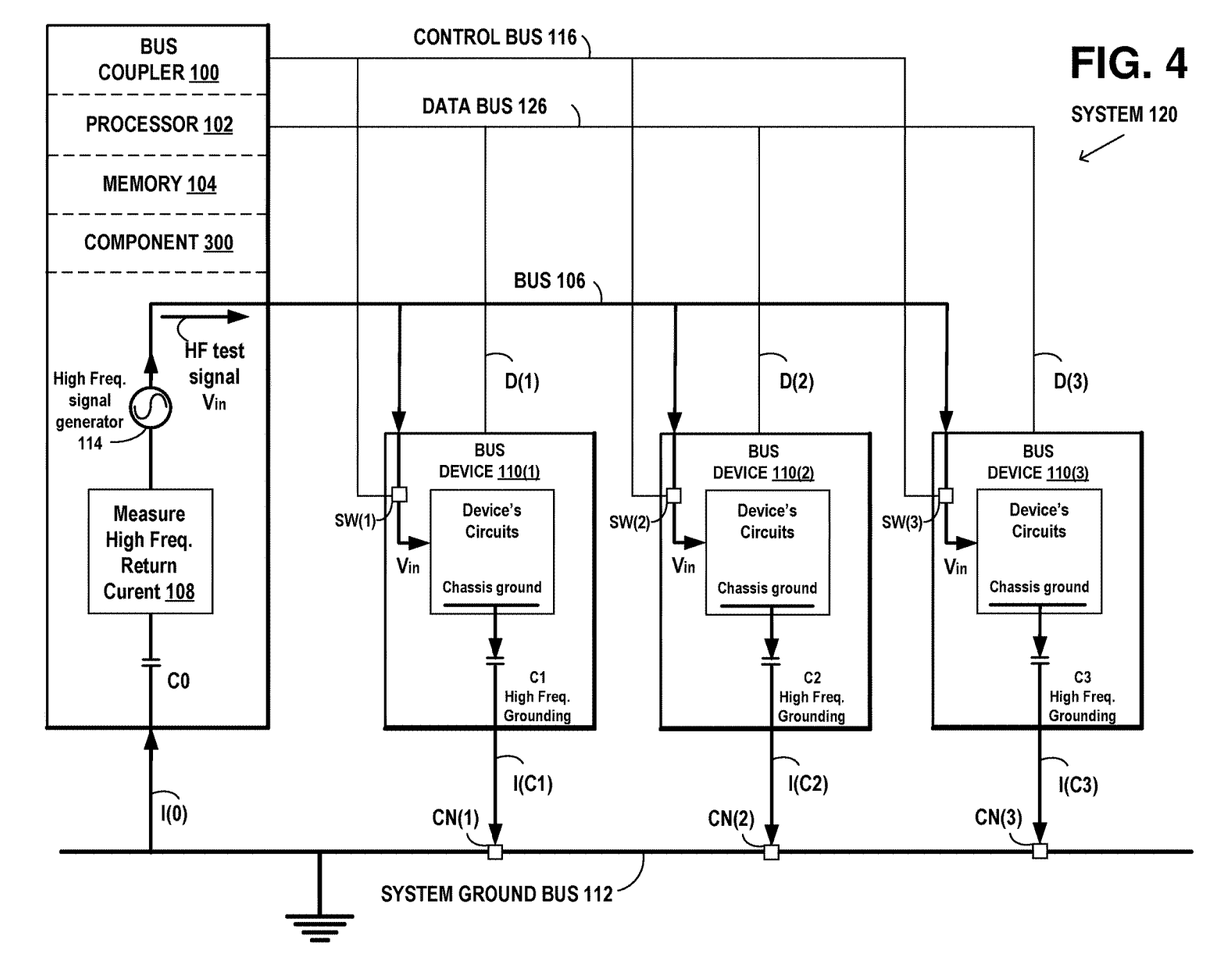
FIG. 4 is an example functional block diagram of the bus coupler of FIG. 1A, wherein a control bus enables separate connection of one or more of the electronic devices to the high frequency signal and a data bus enables monitoring for error conditions in one or more of the electronic devices, according to an embodiment of the disclosure.

FIG. 4 is an example functional block diagram of the bus coupler 100 of FIG. 1A, wherein a control bus 116 enables separate connection of one or more of the electronic devices 110(1), 110(2), and 110(3) to the high frequency signal $V_{in}$. A data bus 126 enables the bus coupler 100 to monitor the electronic devices 110(1), 110(2), and 110(3) for error conditions that may be symptomatic of a failure of capacitive grounding of one of the electronic devices that may be generating the error conditions. Data D(1), D(1), and D(1) output by respective electronic devices 110(1), 110(2), and 110(3) on the data bus 126, is monitored by bus coupler 100 The measurements of capacitive grounding may be made in response to the detection of errors in data computation or in signal transmission from any of the bus devices 110(1), 110(2), and 110(3).

The control bus 116, as previously described for FIG. 1A, may enable separate connection of one or more of the electronic devices 110(1), 110(2), and 110(3) to bus 106 conducting the high frequency signal yin to enable monitoring the adequacy of capacitive grounding of the separately connected electronic devices. In this manner, the bus coupler 100 may selectively isolate one or more of the electronic devices 110(1), 110(2), and 110(3) to determine the adequacy of the selected device's capacitive grounding.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "component", "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. A measurement module for high frequency ground monitoring, comprising:
    at least one processor;
    at least one non-transitory memory including computer program code, wherein the computer program code, when executed by operation of the at least one processor, performs an operation comprising:
    receiving a defined system topology of a system and information on characteristics of components in the system;
    calculating an expected system impedance for the system;
    conducting one or more measurements of actual system impedance of the system using a high frequency voltage stimulus; and
    comparing the one or more measurements of actual system impedance with the expected system impedance to determine adequacy of protective grounding of the system.

2. The measurement module of claim 1, further comprising:
    a high frequency signal generator in the measurement module, configured to provide the high frequency voltage stimulus by injecting a high frequency test signal into the components connected through grounding capacitance to a reference ground of the system;
    a high frequency current measurement circuit in the measurement module, configured to measure actual return current collectively from the components through the grounding capacitance, in response to the test signal, to obtain the one or more measurements of the actual system impedance of the system;
    the at least one memory including computer program code, wherein the computer program code, when executed by operation of the at least one processor, further performs an operation comprising:
    determining whether the actual system impedance substantially equals the expected system impedance; and
    characterizing the adequacy of protective grounding of the system based on the determination.

3. The measurement module of claim 2, further comprising:
    the at least one memory including computer program code, wherein the computer program code, when executed by operation of the at least one processor, further performs an operation comprising:
    determining that the actual system impedance substantially equals the expected system impedance; and
    characterizing the adequacy of protective grounding of the system as acceptable, based on the determination.

4. The measurement module of claim 2, further comprising:
    the at least one memory including computer program code, wherein the computer program code, when executed by operation of the at least one processor, further performs an operation comprising:
    determining that the actual system impedance does not substantially equal the expected system impedance; and
    characterizing the adequacy of protective grounding of the system as not acceptable, based on the determination.

5. The measurement module of claim 4, further comprising:
    the at least one memory including computer program code, wherein the computer program code, when executed by operation of the at least one processor, further performs an operation comprising:
    outputting an indication that the grounding capacitance of the components does not have a good connection to the reference ground of the system.

6. The measurement module of claim 2, further comprising:
    a control bus connecting the measurement module to one or more of the components in the system;
    the at least one memory including computer program code, wherein the computer program code, when executed by operation of the at least one processor, further performs an operation comprising:
    measuring an actual return current from one or more components selected with a control signal on the control bus, through the grounding capacitance, in response to the test signal, to obtain one or more measurements of an actual component impedance of the one or more selected components.

7. The measurement module of claim 2, further comprising:
    a data bus connecting the measurement module to one or more of the components in the system;
    the at least one memory including computer program code, wherein the computer program code, when executed by operation of the at least one processor, further performs an operation comprising:
    monitoring with the data bus, indications of data errors generated by one or more of the components;
    determining a failure of capacitive grounding of the one or more components that is generating the data error indications.

8. The measurement module of claim 1, wherein the conducting of one or more measurements of actual system impedance and the comparing of the one or more measurements of actual system impedance with the expected system impedance, is performed either on a frequent schedule, on demand, or in response to detected error conditions in the system.

9. A method for high frequency ground monitoring, comprising:
- receiving a defined system topology of a system and information on characteristics of components in the system;
- calculating an expected system impedance for the system;
- conducting one or more measurements of actual system impedance of the system using a high frequency voltage stimulus; and
- comparing the one or more measurements of actual system impedance with the expected system impedance to determine adequacy of protective grounding of the system.

10. The method of claim 9, further comprising:
- providing a high frequency voltage stimulus by injecting a high frequency test signal into the components connected through grounding capacitance to a reference ground of the system;
- measuring actual return current collectively from the components through the grounding capacitance, in response to the test signal, to obtain the one or more measurements of the actual system impedance of the system;
- determining whether the actual system impedance substantially equals the expected system impedance; and
- characterizing the adequacy of protective grounding of the system based on the determination.

11. The method of claim 10, further comprising:
- determining that the actual system impedance substantially equals the expected system impedance; and
- characterizing the adequacy of protective grounding of the system as acceptable, based on the determination.

12. The method of claim 10, further comprising:
- determining that the actual system impedance does not substantially equal the expected system impedance; and
- characterizing the adequacy of protective grounding of the system as not acceptable, based on the determination.

13. The method of claim 12, further comprising:
- outputting an indication that the grounding capacitance of the components does not have a good connection to the reference ground of the system.

14. The method of claim 10, further comprising:
- selecting with a control signal on a control bus, one or more of the components in the system to be connected to the high frequency signal generator, to provide the high frequency test signal to the selected one or more components;
- measuring an actual return current from the one or more selected components through the grounding capacitance, in response to the test signal, to obtain one or more measurements of an actual component impedance of the one or more selected components.

15. The method of claim 10, further comprising:
- monitoring with a data bus, indications of data errors generated by one or more of the components;
- determining a failure of capacitive grounding of the one or more components that is generating the data error indications.

16. The method of claim 9, wherein the conducting of one or more measurements of actual system impedance and the comparing of the one or more measurements of actual system impedance with the expected system impedance, is performed either on a frequent schedule, on demand, or in response to detected error conditions in the system.

17. A computer program product, comprising computer executable program code recorded on a computer-readable non-transitory medium, the computer executable program code comprising:
- code for receiving a defined system topology of a system and information on characteristics of components in the system;
- code for calculating an expected system impedance for the system;
- code for conducting one or more measurements of actual system impedance of the system using a high frequency voltage stimulus; and
- code for comparing the one or more measurements of actual system impedance with the expected system impedance to determine adequacy of protective grounding of the system.

18. The computer program product of claim 17, further comprising:
- code for providing a high frequency voltage stimulus by injecting a high frequency test signal into the components connected through grounding capacitance to a reference ground of the system;
- code for measuring actual return current collectively from the components through the grounding capacitance, in response to the test signal, to obtain the one or more measurements of the actual system impedance of the system;
- code for determining whether the actual system impedance substantially equals the expected system impedance; and
- code for characterizing the adequacy of protective grounding of the system based on the determination.

19. The computer program product of claim 18, further comprising:
- code for determining that the actual system impedance substantially equals the expected system impedance; and
- code for characterizing the adequacy of protective grounding of the system as acceptable, based on the determination.

20. The computer program product of claim 18, further comprising:
- code for determining that the actual system impedance does not substantially equal the expected system impedance; and
- code for characterizing the adequacy of protective grounding of the system as not acceptable, based on the determination.

* * * * *